US009478636B2

(12) United States Patent
Chen et al.

(10) Patent No.: US 9,478,636 B2
(45) Date of Patent: Oct. 25, 2016

(54) METHOD OF FORMING SEMICONDUCTOR DEVICE INCLUDING SOURCE/DRAIN CONTACT HAVING HEIGHT BELOW GATE STACK

(71) Applicant: Taiwan Semiconductor Manufacturing Company, Ltd., Hsin-Chu (TW)

(72) Inventors: Chih-Liang Chen, Hsinchu (TW); Chih-Ming Lai, Hsinchu (TW); Kam-Tou Sio, Hsinchu County (TW); Ru-Gun Liu, Hsinchu County (TW); Meng-Hung Shen, Hsin-Chu (TW); Chun-Hung Liou, Hsinchu (TW); Shu-Hui Sung, Hsinchu County (TW); Charles Chew-Yuen Young, Cupertino, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/280,196

(22) Filed: May 16, 2014

(65) Prior Publication Data
US 2015/0332962 A1    Nov. 19, 2015

(51) Int. Cl.
*G01R 31/26* (2014.01)
*H01L 29/66* (2006.01)
*H01L 21/768* (2006.01)
*H01L 23/535* (2006.01)
*H01L 23/48* (2006.01)
*H01L 21/8234* (2006.01)

(52) U.S. Cl.
CPC ....... *H01L 29/66583* (2013.01); *H01L 21/768* (2013.01); *H01L 21/76819* (2013.01); *H01L 21/76879* (2013.01); *H01L 21/76895* (2013.01); *H01L 21/823418* (2013.01); *H01L 21/823437* (2013.01); *H01L 21/823475* (2013.01); *H01L 23/48* (2013.01); *H01L 23/535* (2013.01); *H01L 29/665* (2013.01); *H01L 2924/0002* (2013.01)

(58) Field of Classification Search
CPC .................. H01L 21/76819; H01L 21/76879; H01L 21/76895; H01L 23/535
USPC ......................................................... 438/14
See application file for complete search history.

(56) References Cited

U.S. PATENT DOCUMENTS

| 8,586,436 B2 | 11/2013 | Ng et al. | |
|---|---|---|---|
| 2008/0099921 A1* | 5/2008 | Katata ............... | H01L 21/76877 257/751 |
| 2008/0116583 A1* | 5/2008 | Yuki ................. | H01L 21/28525 257/774 |

(Continued)

Primary Examiner — Matthew Gordon
(74) Attorney, Agent, or Firm — Haynes and Boone, LLP

(57) ABSTRACT

Provided is a semiconductor device and methods of forming the same. The semiconductor device includes a substrate having source/drain regions and a channel region between the source/drain regions; a gate structure over the substrate and adjacent to the channel region; source/drain contacts over the source/drain regions and electrically connecting to the source/drain regions; and a contact protection layer over the source/drain contacts. The gate structure includes a gate stack and a spacer. A top surface of the source/drain contacts is lower than a top surface of the spacer, which is substantially co-planar with a top surface of the contact protection layer. The contact protection layer prevents accidental shorts between the gate stack and the source/drain regions when gate vias are formed over the gate stack. Therefore, gate vias may be formed over any portion of the gate stack, even in areas that overlap the channel region from a top view.

20 Claims, 16 Drawing Sheets

(56) References Cited

U.S. PATENT DOCUMENTS

| | | | |
|---|---|---|---|
| 2012/0181623 A1* | 7/2012 | Luo | H01L 21/823418 257/382 |
| 2013/0175583 A1* | 7/2013 | Yuan | H01L 23/485 257/288 |
| 2013/0249010 A1* | 9/2013 | Ng | H01L 21/823842 257/369 |

* cited by examiner

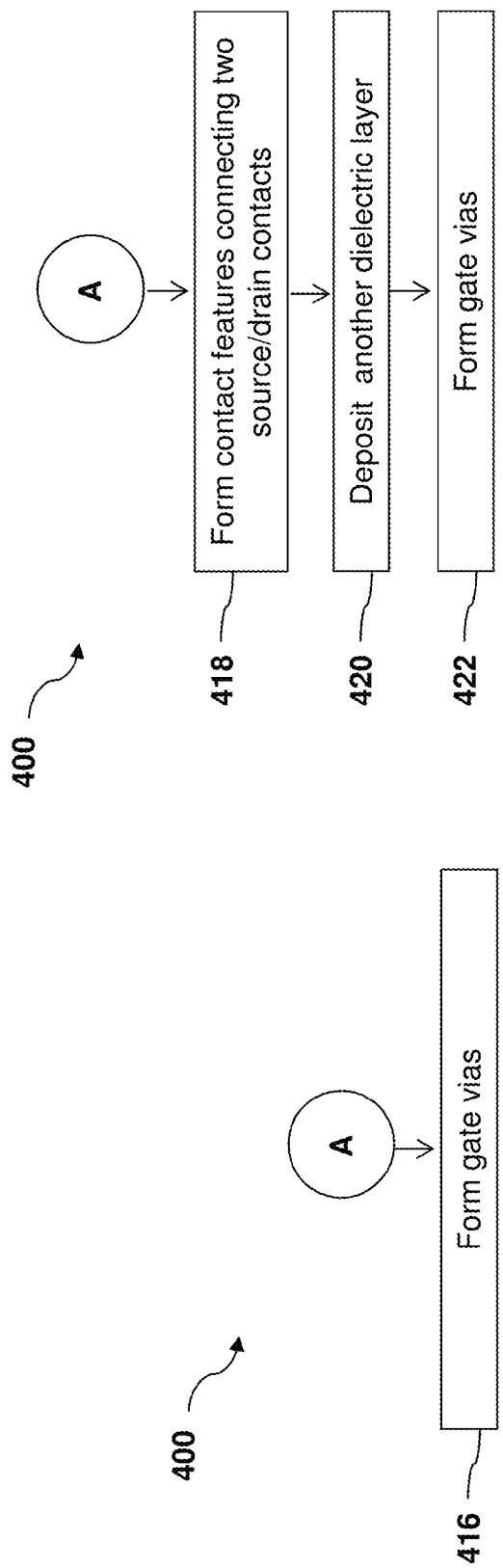

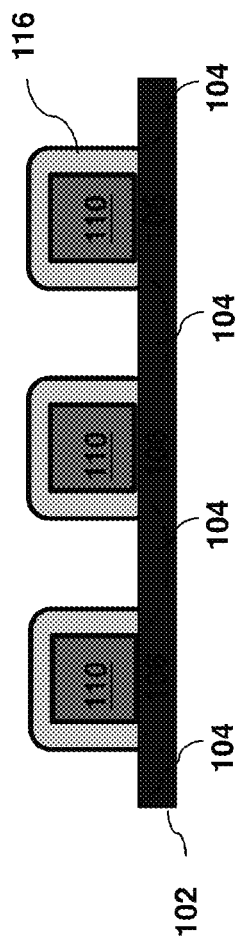
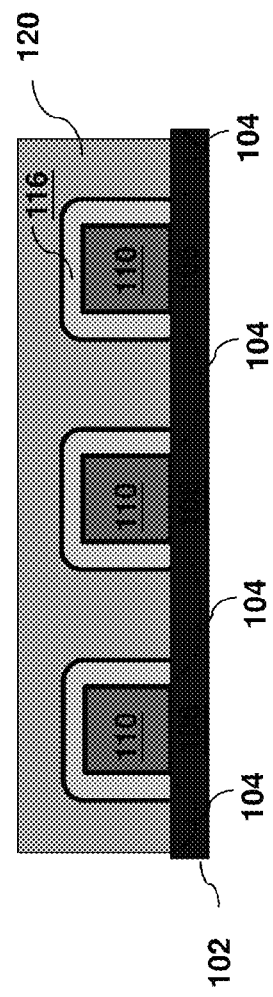
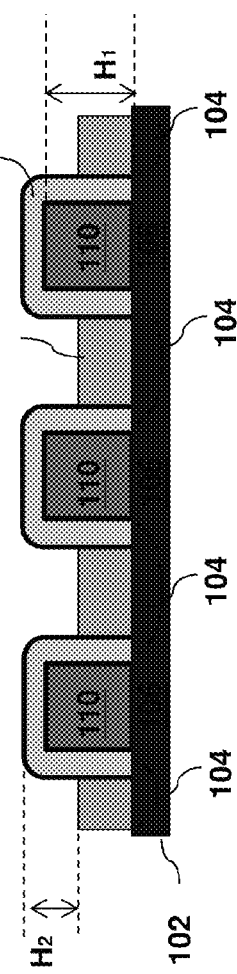
FIG. 5A
FIG. 5B
FIG. 5C

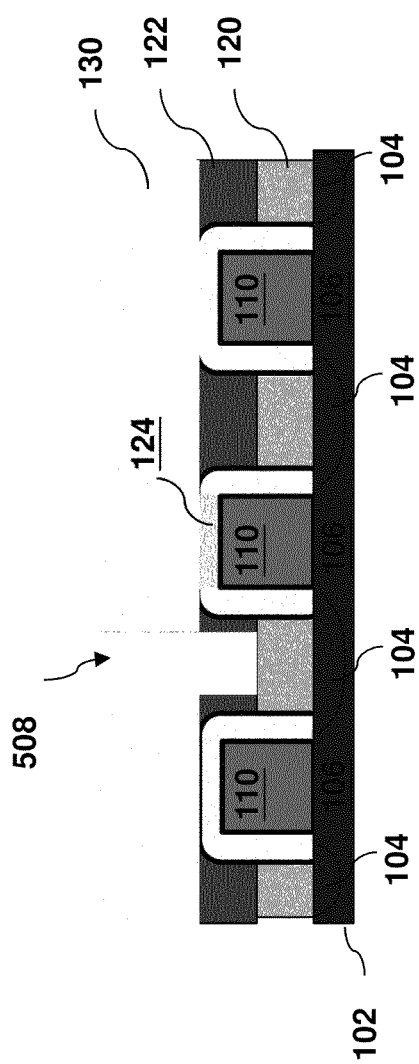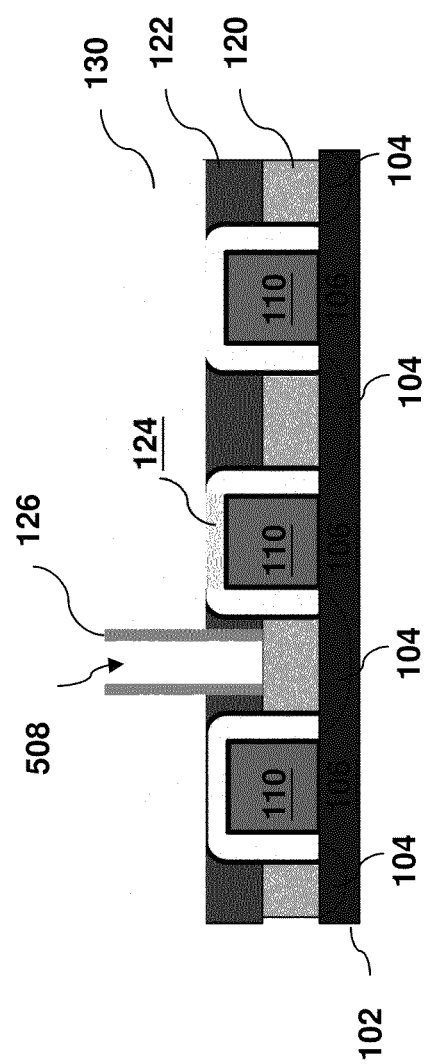

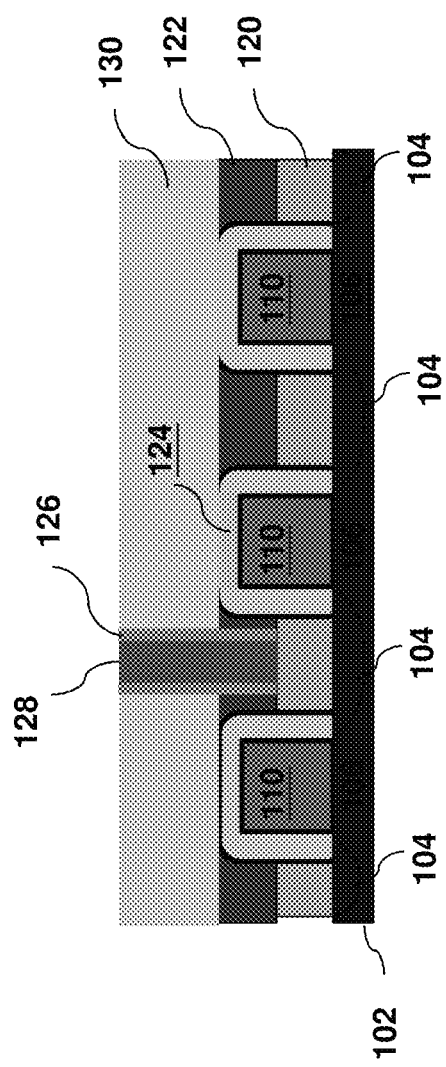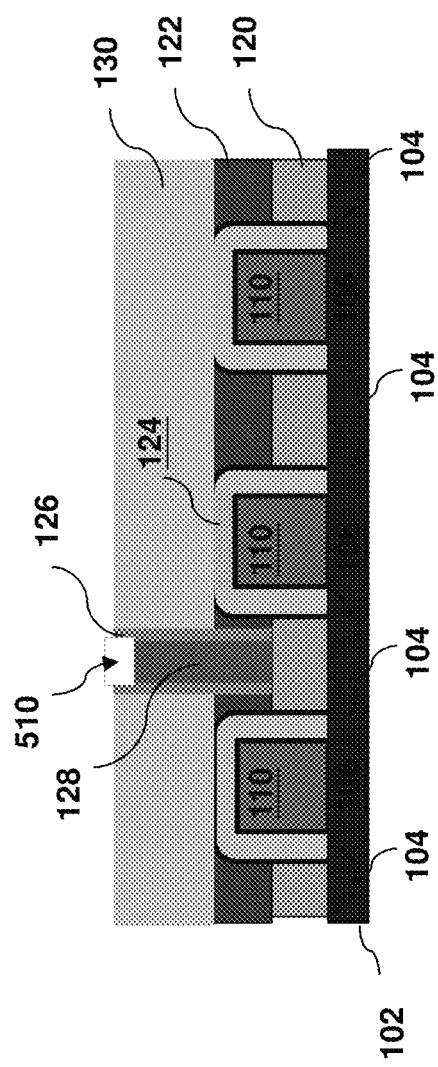

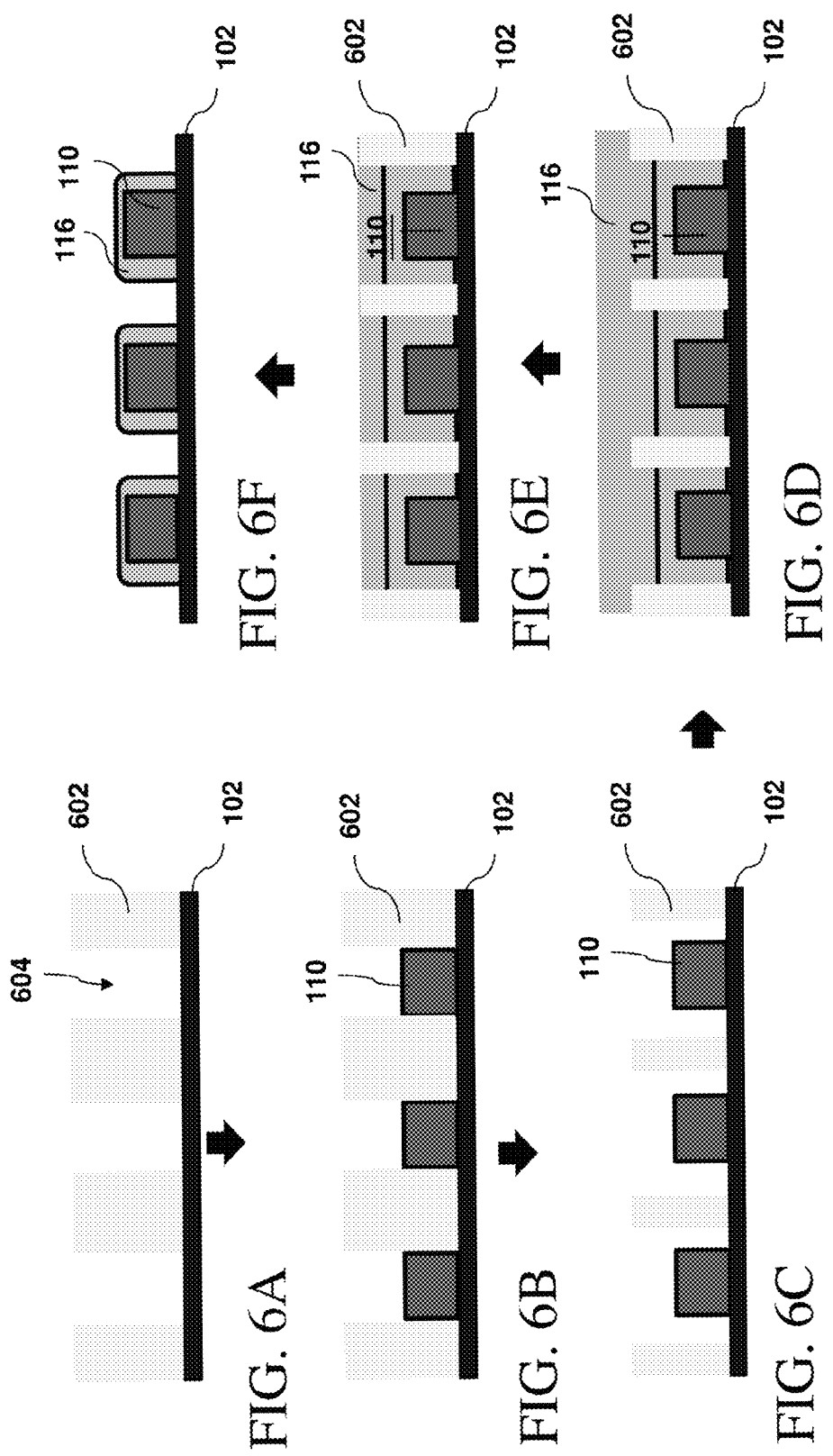

METHOD OF FORMING SEMICONDUCTOR DEVICE INCLUDING SOURCE/DRAIN CONTACT HAVING HEIGHT BELOW GATE STACK

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, field effect transistors (FETs) typically include active regions and gate structures over the active regions. Conductive features, such as contacts and vias, are formed on the FETs for providing electrical connection from a terminal (e.g., source/drain/gate) of an FET to terminal(s) of another FET. Traditionally, vias on gate (or gate vias) are restricted to landing areas away from the active regions of the FETs. This is to prevent the gate vias from being accidentally connected to the sources or drains located in the active regions due to process variation. This creates issues, especially for FETs having many gate vias, because there may not be enough landing areas outside the active regions on a semiconductor device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4A-4C is a flow chart of a method of forming a semiconductor device according to various aspects of the present disclosure.

FIGS. 5A-5K are cross-sectional views of a portion of a semiconductor device constructed according to the method in FIGS. 4A and 4B, in accordance with an embodiment.

FIGS. 5L-5R are cross-sectional views of a portion of another semiconductor device constructed according to the method in FIGS. 4A and 4C, in accordance with an embodiment.

FIGS. 6A-6F are cross-sectional views of a portion of a semiconductor device constructed according to the method of FIG. 4A, in accordance with an embodiment.

DETAILED DESCRIPTION

Figure 1:
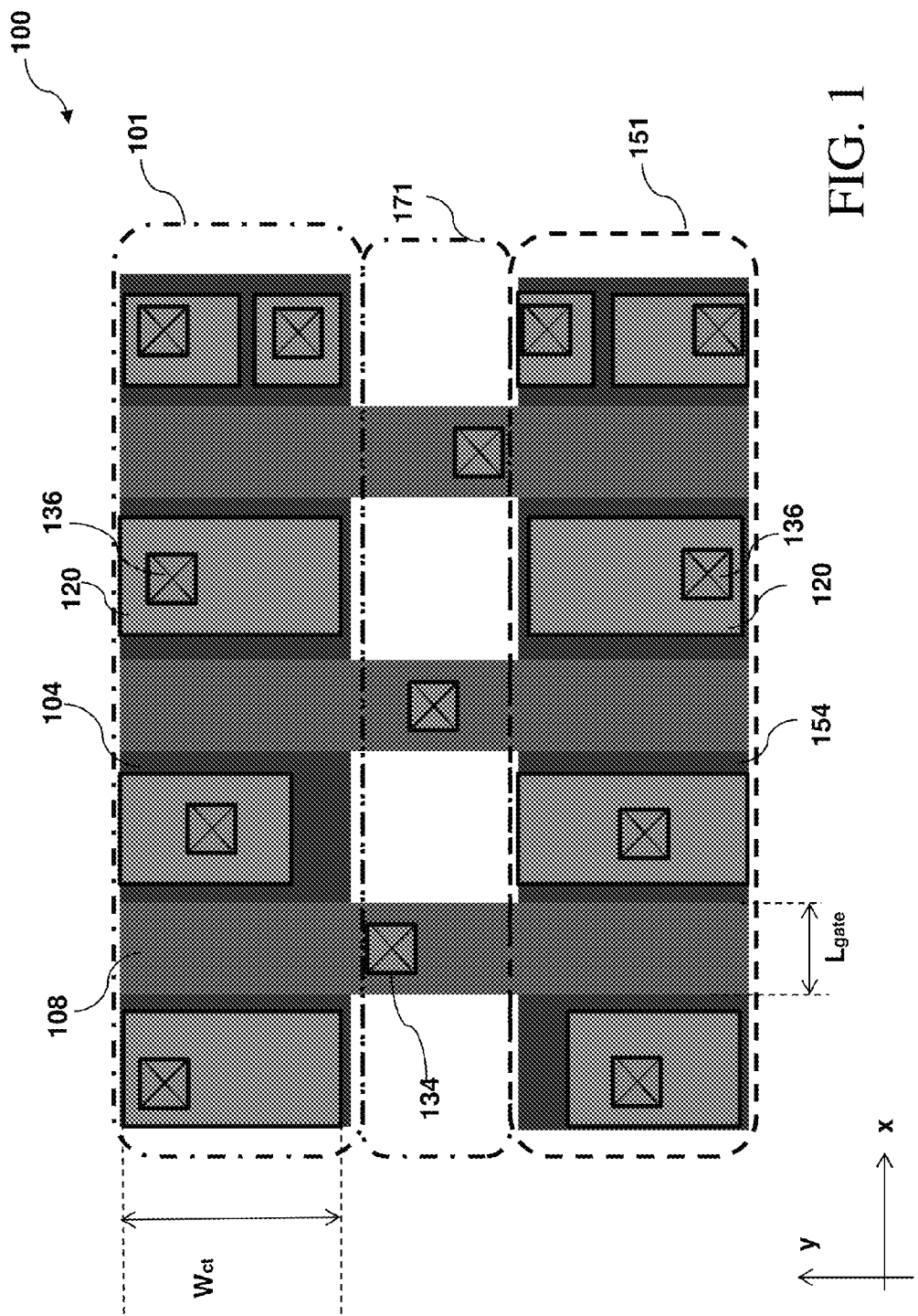
FIG. 1 is a top view of a portion of a semiconductor device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and methods of forming the same. More particularly, the present disclosure provides an improved transistor design and formation where gate via landing areas are not restricted to areas outside of active regions of the transistors. One objective of the present disclosure is to provide more landing areas in a semiconductor device for gate vias, the number of which has been increasing in advanced semiconductor process nodes. Another objective is to enable process and design co-optimization where a semiconductor device's area and/or performance are optimized without penalty on the process window. This provides immediate benefits to both circuit design and process control.

FIG. 1 illustrates a top view of a portion of a semiconductor device 100. The semiconductor device 100 includes a first active region 101 and a second active region 151 formed on a substrate. The active regions 101 and 151 may be of the same diffusion type (e.g., both are n-type or p-type) or of different diffusion types (e.g., one is n-type and another is p-type). The active regions 101 and 151 are spaced apart by a non-active region 171. The semiconductor device 100 further includes a plurality of gate structures (or gate electrodes) 108 which extend lengthwise across the active regions 101 and 151 in "y" direction and are spaced apart from each other in "x" direction. The active region 101 includes a plurality of source/drain regions 104 adjacent to and sandwiching the gate structures 108. The source/drain regions 104 and the gate structures 108 collectively define a first plurality of transistors in the active region 101. The active region 151 includes a plurality of source/drain regions 154 adjacent to and sandwiching the gate structures 108. The source/drain regions 154 and the gate structures 108 collectively define a second plurality of transistors in the active region 151. In accordance with conventional nomenclature, the "x" direction is also referred to as the gate length direction of the transistors, and the "y" direction the gate width direction of the transistors. The semiconductor device 100 further includes a plurality of source/drain contacts 120 which electrically connect to the source/drain regions 104 and 154 and provide landing areas for source/drain vias 136. Some of the source/drain contacts 120 are long contacts in that their dimension in the "y" direction ("$W_{ct}$") is relatively large, for example, being 1.6 greater than a dimension of gate structure 108 in the "x" direction ("$L_{gate}$"). Long contacts provide larger landing areas and reduced resistance for the source/drain vias 136. The semiconductor device 100 further includes gate vias 134 landing on the gate structures 108. The gate vias 134 and the source/drain vias 136 may be connected among themselves or to vias in another portion of the semiconductor device 100. For example, they may be connected through conductive features in another layer of the semiconductor device 100, such as metal interconnects, in order to form a complete device such as an integrated circuit (IC).

As semiconductor process technology continues to scale down, process variations have become more and more challenging in the manufacturing of ICs, such as the semiconductor device 100. For example, the gate vias 134, designed to land in the middle of the gate structures 108 in the "x" direction, may nonetheless shift to one side of, or even outside of, the gate structures 108 due to process variations. If the gate vias 134 are designed to land on the portion of the gate structures 108 that overlaps the active regions 101/151, there is a risk that these gate vias 134 might accidentally connect the gate structures 108 with the source/drain regions 104/154 and/or source/drain contacts 120, causing manufacturing defects in the IC. To avoid this problem, one method is to restrict the landing areas of the gate vias 134 into the non-active region 171. However, when the number of gate vias 134 increases such as in the case of multi-gate devices, the area of the non-active region 171 is no longer sufficient. One approach is to increase the area of the non-active region 171 correspondingly. But this is not a good use of the substrate. Another approach is to shrink the active regions 101 and 151 to give room for the gate vias. But this compromises performance of the IC. The present disclosure provides a method to over this issue.

Figure 2A:
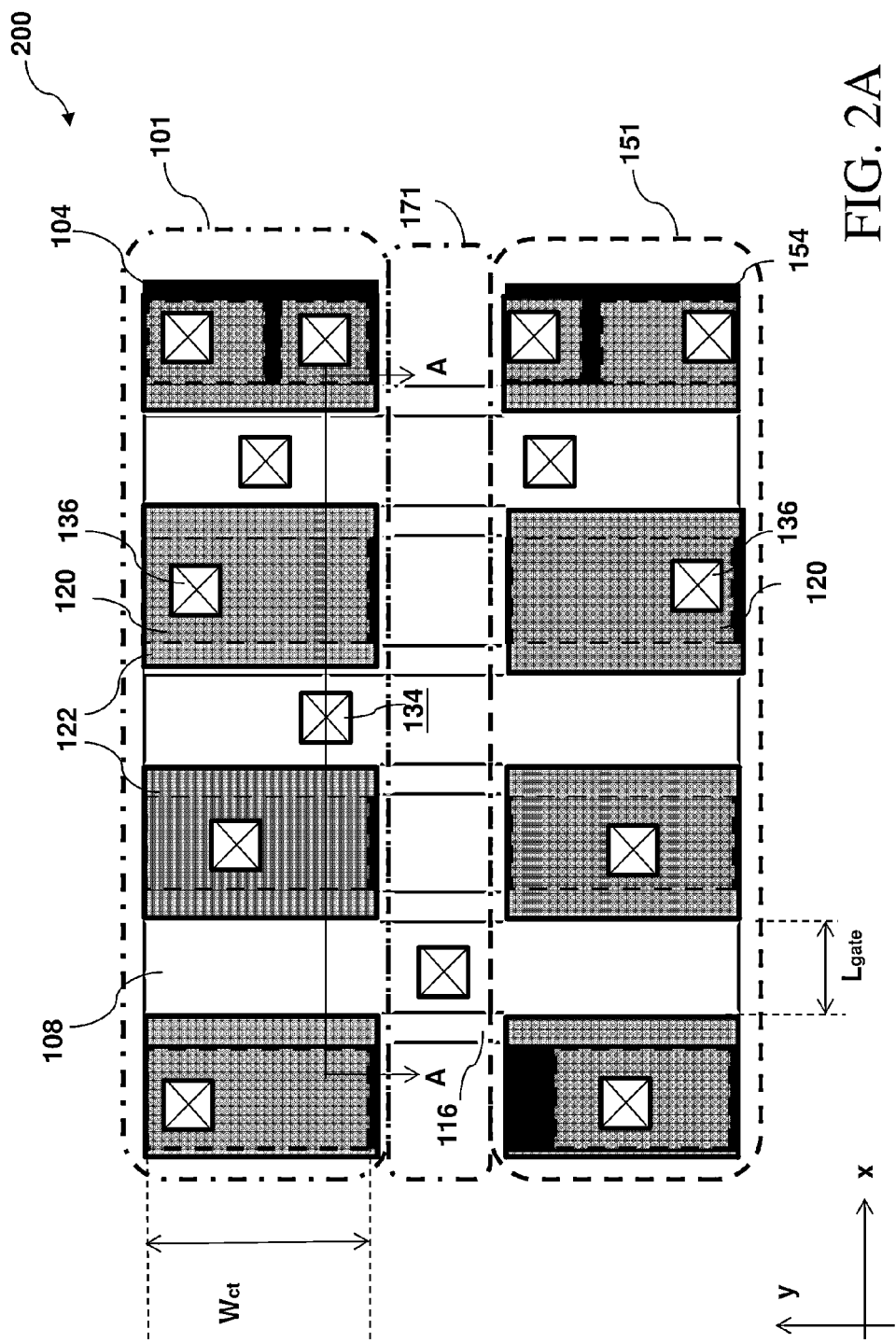
FIGS. 2A and 2B are top and cross-sectional views of a portion of a semiconductor device constructed according to various aspects of the present disclosure.
Figure 2B:
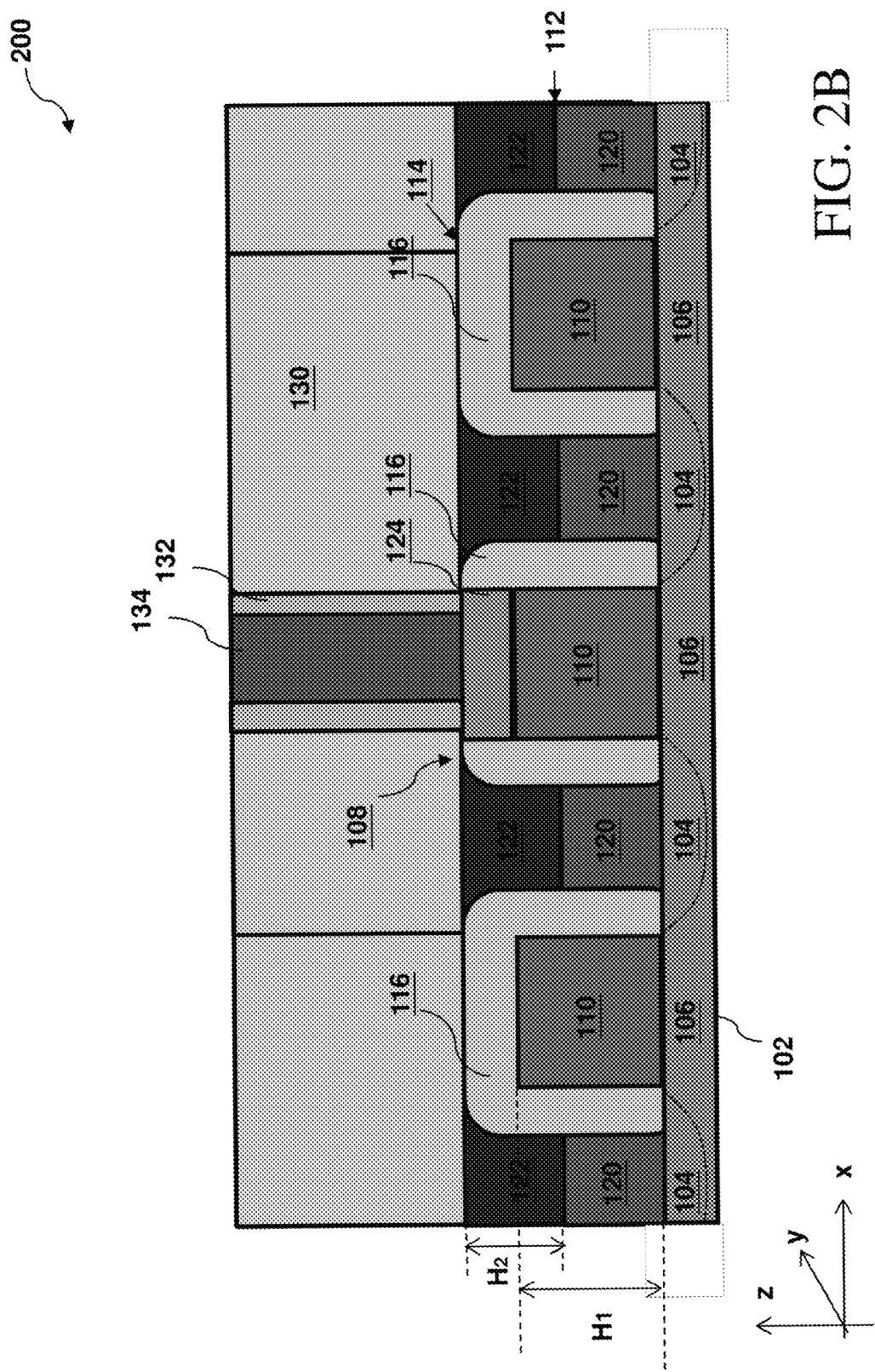

FIG. 2A illustrates a top view of a portion of a semiconductor device 200 constructed according to various aspects of the present disclosure. FIG. 2B illustrates a cross sectional view of the semiconductor device 200 along the "A-A" line of the FIG. 2A. The semiconductor device 200 is provided for illustration purposes and does not necessarily limit the embodiments of the present disclosure to any number of devices, any number of regions, or any configuration of structures of regions. Furthermore, the semiconductor device 200 as shown in FIGS. 2A and 2B may be an intermediate device fabricated during processing of an IC, or a portion thereof, that may comprise static random access memory (SRAM) and/or other logic circuits, passive components such as resistors, capacitors, and inductors, and active components such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. The semiconductor device 200 will be described below with reference to the FIGS. 2A and 2B collectively.

Many aspects of the semiconductor device 200 are similar to those of the semiconductor device 100, as shown by the repeated reference numerals. For example, the semiconductor device 200 also includes active regions 101 and 151 separated by a non-active region 171, and includes source/drain regions 104 and 154, source/drain contacts 120, source/drain vias 136, gate structures 108, and gate vias 134.

Referring to FIG. 2B, the semiconductor device 200 is formed over a substrate 102. The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor on insulator (SOI).

Also shown in FIG. 2B, the semiconductor device 200 includes channel regions 106 between the source/drain regions 104. The channel regions 106 conduct currents between the respective source/drain regions 104 when the semiconductor device 200 is in use. The channel regions 106 and the source/drain regions 104 are formed in a portion of the substrate 102, more particularly, in a portion of the active region 101 (FIG. 2A).

Still referring to FIG. 2B, the gate structure 108 includes a gate stack 110 and a gate open conductor 124 that provides a landing area for the gate via 134. The gate stack 110 is a multi-layer structure formed over the substrate 102 and adjacent to the channel region 106. In an embodiment, the gate stack 110 includes an interfacial layer and a polysilicon (or poly) layer over the interfacial layer. In some embodiments, the gate stack 110 may further include a gate dielectric layer and a metal gate layer disposed between the interfacial layer and the poly layer. In some embodiments, the gate stack 110 includes one or more metal layers in place of the poly layer. In various embodiments, the interfacial layer includes a dielectric material such as silicon oxide ($SiO_2$) or silicon oxynitride (SiON), and can be formed by chemical oxidation, thermal oxidation, atomic layer deposition (ALD), chemical vapor deposition (CVD), and/or other suitable methods. The poly layer can be formed by suitable deposition processes such as low-pressure chemical vapor deposition (LPCVD) and plasma-enhanced CVD (PECVD). The gate dielectric layer may use a high-k dielectric material such as hafnium oxide ($HfO_2$), $Al_2O_3$, lanthanide oxides, $TiO_2$, HfZrO, $Ta_2O_3$, $HfSiO_4$, $ZrO_2$, $ZrSiO_2$, combinations thereof, or other suitable material; and may be formed by ALD and/or other suitable methods. The metal gate layer may include a p-type work function metal or an n-type work function metal, and may be deposited by CVD, PVD, and/or other suitable process. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The one or more metal layers may use aluminum (Al), tungsten (W), copper (Cu), cobalt (Co), and/or other suitable materials; and may be formed by CVD, PVD, plating, and/or other suitable processes.

Still referring to FIG. 2B, the gate structure 108 further includes spacers 116 on and/or around the gate stack 110. In various embodiments, the spacers 116 include a dielectric material, such as silicon oxide, silicon nitride, silicon oxynitride, other dielectric material, or combination thereof. The spacers 116 may include one or more layers. The spacer 116 protects the gate stack 110 during various manufacturing processes. The spacer 116 also serves for offset purposes when the source/drain regions 104 are formed in the substrate 102.

The source/drain contacts 120 are formed between the spacers 116. In the present embodiment, the source/drain contacts 120 use a metal, such as aluminum (Al), tungsten (W), copper (Cu), cobalt (Co), or other suitable material. In embodiments, the semiconductor device 200 further includes silicide features between the source/drain contacts 120 and the source/drain regions 104 for reducing resistance and enhancing connectivity. In the present embodiment, the source/drain contacts 120 are formed to have a top surface 112 below a top surface 114 of the gate structure 108.

Referring to FIGS. 2A and 2B, the semiconductor device 200 further includes a contact protection layer 122 over the source/drain regions 104/154 and over the source/drain contacts 120. The contact protection layer 122 protects the source/drain regions 104/154 and the source/drain contacts 120 from being accidentally connected to the gate vias 134 during manufacturing processes. In the present embodiment, the contact protection layer 122 includes a dielectric material different from that of the spacers 116. In various embodiments, the contact protection layer 122 may use titanium oxide (TiO$_2$), silicon oxide (SiO$_2$), silicon oxynitride (SiON), silicon nitride (SiN$_3$), combinations thereof, or other suitable material. In the present embodiment, the contact protection layer 122 is formed between the spacers 116 using a self-aligned formation process, which will be described in more details in a later section. In the present embodiment, a top surface of the contact protection layer 122 is substantially co-planar with the surface 114. In various embodiments, the contact protection layer 122 is formed to have a thickness "H$_2$" that is about 0.2~4 times the height "H$_1$" of the gate stack 110 in the "z" direction.

As can be seen from FIG. 2A, in the present embodiment, the gate vias 134 are no longer restricted to the non-active region 171, unlike those in FIG. 1, attributable to the presence of the contact protection layer 122. Potential location misalignment of the gate vias 134 no longer poses a risk of shorting the gate structure 108 with the source/drains 104/154 and/or the source/drain contacts 120. This provides circuit designers with great latitude in optimizing the semiconductor device 200. For example, the dimension of the non-active region 171 along the "y" direction can be reduced in the semiconductor device 200, resulting in a smaller substrate area than the semiconductor device 100. For another example, the active regions 101 and/or 151 of the semiconductor device 200 can be expanded towards each other along the "y" direction so as to enhance the performance of the transistors thereon, resulting in better performance than the semiconductor device 100 with the same substrate area. In some embodiments, both area reduction and performance enhancement can be achieved. From manufacturing process point of view, process parameters may be relaxed with respect to the gate via location and alignment.

Referring to FIG. 2B, the semiconductor device 200 further includes an inter-layer dielectric (ILD) layer 130. The ILD layer 130 may include dielectric materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), titanium oxide (TiO$_2$), silicon oxide (SiO$_2$), silicon oxynitride (SiON), silicon nitride (SiN$_3$), and/or other suitable dielectric materials. The gate via 134 is formed in an opening through the ILD layer 130 and exposing the gate open conductor 124. The gate via 134 provides connectivity between the gate open conductor 124 and other terminals of the semiconductor device 200. The gate via 134 may use a metal, such as aluminum (Al), tungsten (W), copper (Cu), cobalt (Co), or other suitable material. In the present embodiment, the semiconductor device 200 further includes a barrier layer 132 between the gate via 134 and the ILD layer 130, preventing the material of the gate via 134 from diffusing into the ILD layer 130.

Figure 3A:
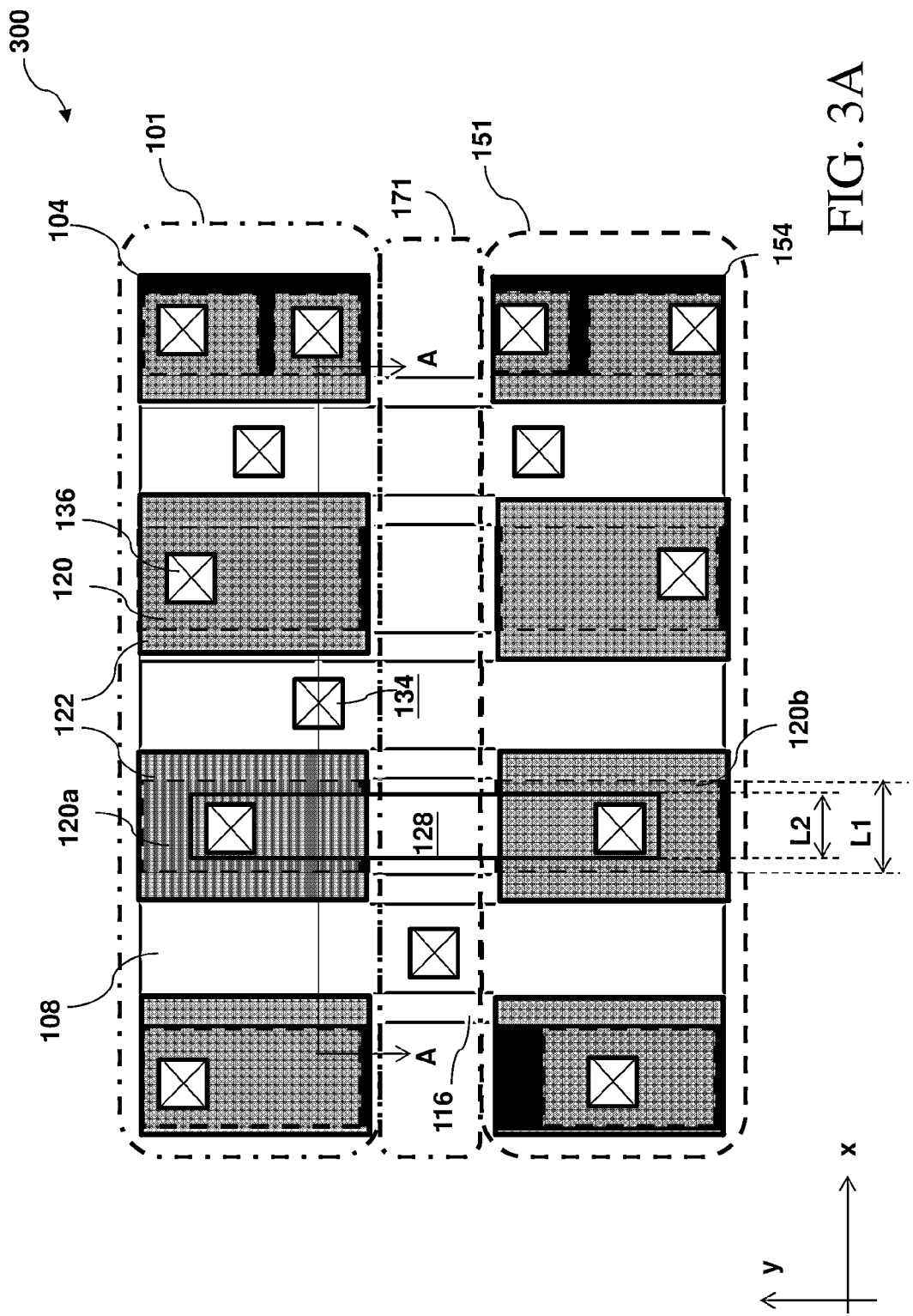
FIGS. 3A and 3B are top and cross-sectional views of a portion of another semiconductor device constructed according to various aspects of the present disclosure.
Figure 3B:
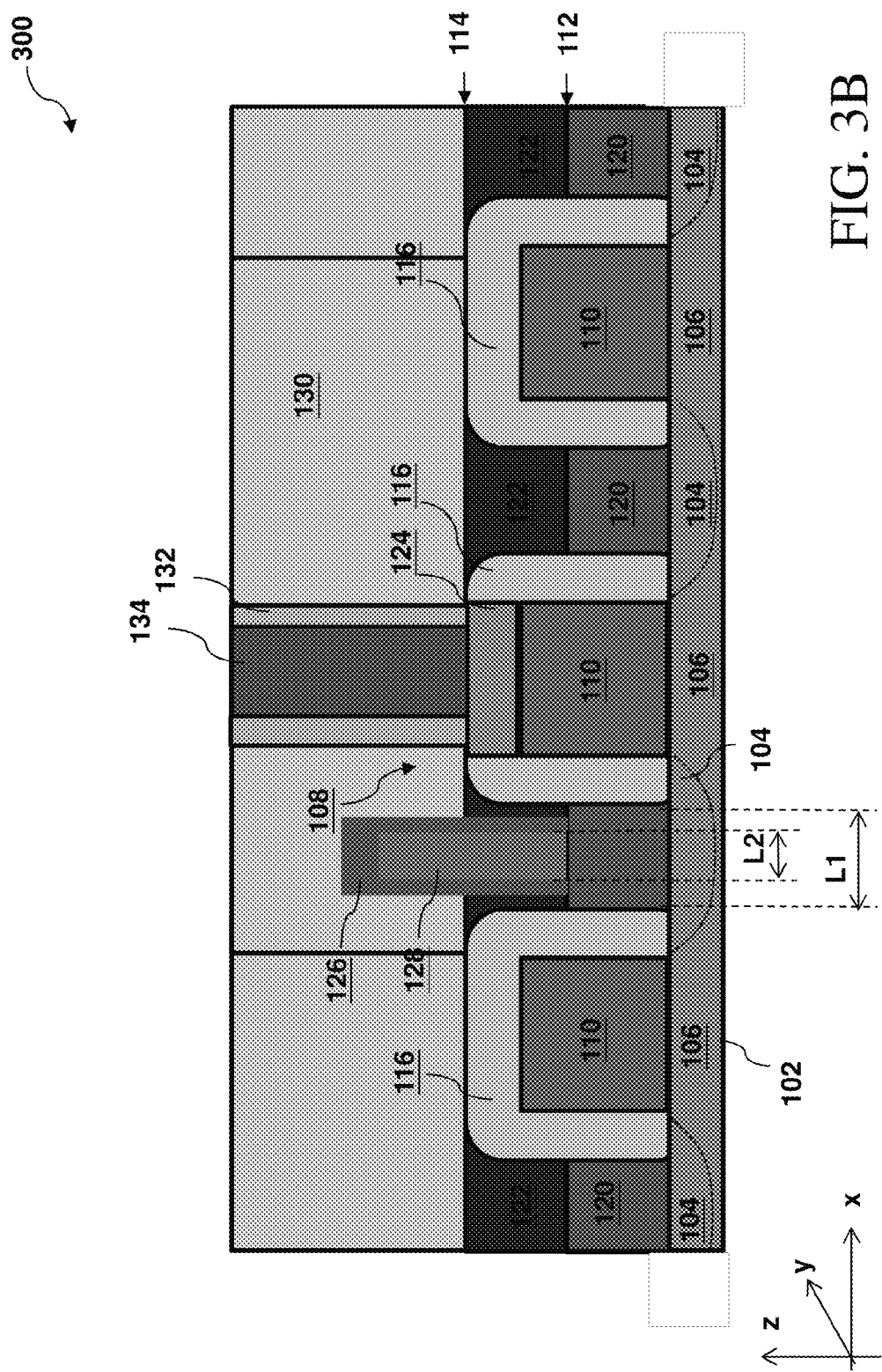

FIG. 3A illustrates a top view of a portion of a semiconductor device 300 constructed according to various aspects of the present disclosure. FIG. 3B illustrates a cross sectional view of the semiconductor device 300 along the "A-A" line of the FIG. 3A. Many aspects of the semiconductor device 300 are similar to those of the semiconductor device 200, as shown by the repeated reference numerals. In the present embodiment, the semiconductor device 300 includes a contact feature 128 as a local interconnect between two transistors. From a top view (FIG. 3A), the contact feature 128 overlaps a portion of the source/drain contacts 120a and 120b respectively and has a smaller dimension ("L$_2$") than a dimension ("L$_1$") of the source/drain contacts 120a and 120b along the "x" direction. From a cross sectional view (FIG. 3B), the contact feature 128 is formed over the respective source/drain contacts 120 and straddles in the contact protection layer 122 and the ILD layer 130. In the following discussion, the source/drain contacts 120 are also referred to as the first level contact and the contact feature 128 is also referred to as the second level contact. In the present embodiment, the second level contact 128 uses a metal, such as aluminum (Al), tungsten (W), copper (Cu), cobalt (Co), or other suitable material. In the present embodiment, the second level contact 128 is surrounded by a barrier layer 126 which prevents the material of the second level contact 128 from diffusing into the ILD layer 130. As can be seen in FIG. 3A, the second level contact 128 provides a very short electrical connection between two transistors.

Figure 4A:
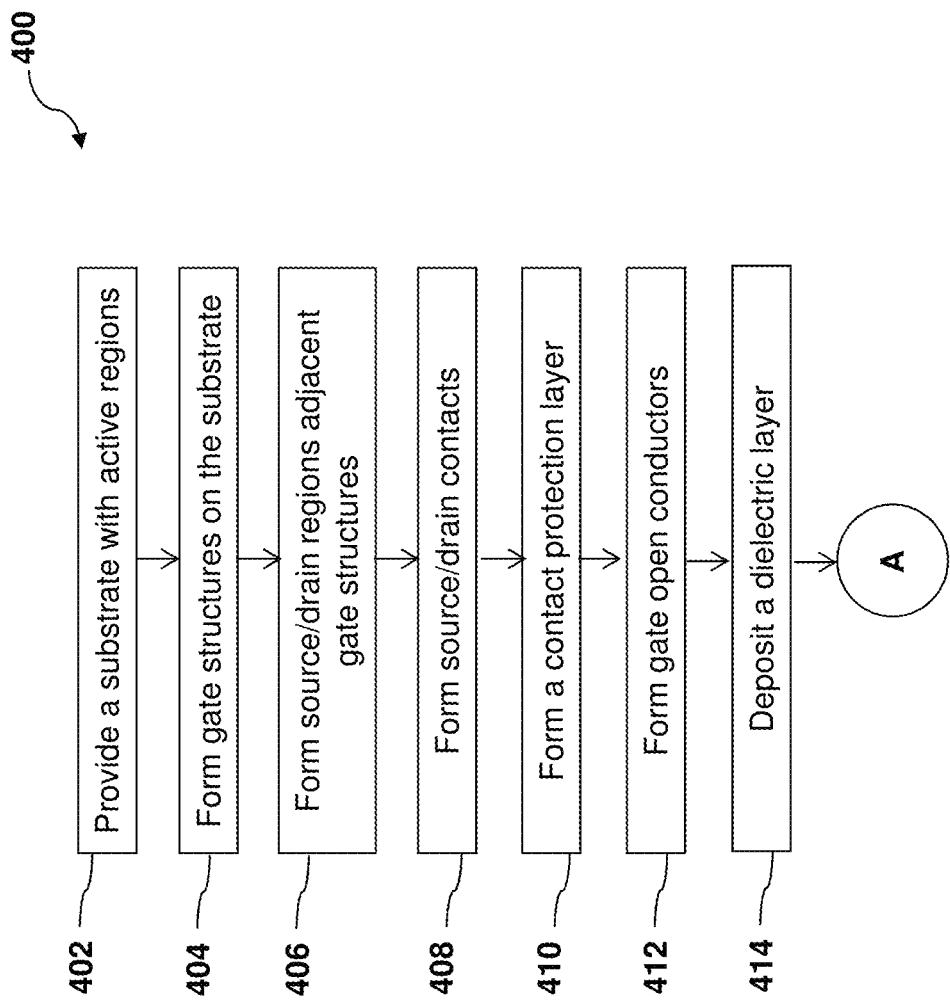

FIGS. 4A-4C illustrates a flow chart of a method 400 of forming a semiconductor device, such as the semiconductor devices 200 and 300, according to various aspects of the present disclosure. The method 400 is merely an example, and is not intended to limit the present disclosure beyond what is explicitly recited in the claims. Additional operations can be provided before, during, and after the method 400, and some operations described can be replaced, eliminated, or moved around for additional embodiments of the method. The method 400 is described below in conjunction with FIGS. 5A-5K which are cross-sectional views of the semiconductor device 200 (FIGS. 2A and 2B) in various stages of a manufacturing process. Then, the method 400 is described in conjunction with FIGS. 5L-5R which are cross-sectional views of the semiconductor device 300 (FIGS. 3A and 3B) in various stages of a manufacturing process.

At operation 402, the method 400 (FIG. 4A) provides a substrate such as the substrate 102 with active regions 101 and 151 separated by a non-active region 171 (FIG. 2A). The active region 101 (or 151) may be a p-type field effect transistor region, such as an n-well in a p-type substrate, for forming PFETs. Alternatively, the active region 101 (or 151) may be an n-type field effect transistor region for forming NFETs. In some embodiments, the active regions 101 and 151 are of different diffusion type for forming CMOSFETs.

At operation 404, the method 400 (FIG. 4A) forms gate stacks on the substrate, such as the gate stacks 110 (FIG. 2B). The various layers of the gate stacks 110 (interfacial layer, gate dielectric layer, poly layer, work function metal layer, etc.) can be formed by various deposition processes, such as chemical oxidation, thermal oxidation, atomic layer deposition (ALD), chemical vapor deposition (CVD), low-pressure chemical vapor deposition (LPCVD), plasma-enhanced CVD (PECVD), and/or other suitable methods. In the present embodiment as illustrated in FIG. 5A, the method 100 further forms a spacer 116 surrounding the gate stack 110 at its top and sidewalls. In an embodiment, forming the spacer 116 includes multiple operations as illustrated in FIGS. 6A through 6F. For example, a dielectric material 602 is deposited over the substrate 102 and is patterned through a photolithography process and an etching process thereby forming openings 604 as placeholders for the gate stacks 110 (FIG. 6A). The gate stacks 110 are formed by depositing suitable materials into the openings 604 followed by an etching back process (FIG. 6B). The patterned dielectric material 602 is thinned through an etching process (FIG. 6C). A spacer material 116 is deposited over the thinned dielectric material 602 and the gate stack 110, filling the spaces between the thinned dielectric material 602 and the gate stack 110 (FIG. 6D). The spacer material 116 is etched back to expose a top surface of the thinned dielectric material 602 (FIG. 6E). Finally, the thinned dielectric material 602 is removed by an etching process tuned to selectively remove the dielectric material 602 while the spacer material 116 remains (FIG. 6F).

At operation 406, the method 400 (FIG. 4A) forms source/drain regions 104 in the substrate 102 adjacent the gate structures 110/116 (FIG. 5A). The source/drain regions 104 sandwich channel regions 106 that underneath the gate stack 110. The source/drain regions 104 may include the introduction of suitable dopant types: n-type or p-type dopants. The source/drain regions 104 may include halo or lightly doped drain (LDD) implantation, source/drain implantation, source/drain activation and/or other suitable processes. In some embodiments, the source/drain regions 104 may include raised source/drain regions, strained regions, epitaxially grown regions, and/or other suitable techniques. In a further embodiment, the source/drain activation process may include a rapid thermal annealing. In an embodiment, operation 406 includes the silicidation of the doped source/drain regions 104. The silicide materials may include nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The silicide features can be formed by a process that includes depositing a metal layer, annealing the metal layer such that the metal layer is able to react with silicon to form silicide, and then removing the non-reacted metal layer.

At operation 408, the method 400 (FIG. 4A) forms source/drain contacts 120, electrically contacting the source/drain regions 104 (FIGS. 5B-5C). Referring to FIG. 5B, a conductive material 120 is deposited over the substrate 102 including the source/drain regions 104, and over the gate structures 110/116. In an embodiment, the conductive material 120 is a metal such as aluminum (Al), tungsten (W), copper (Cu), cobalt (Co), combinations thereof, or other suitable material. The conductive material 120 can be deposited using a suitable process, such as CVD, PVD, plating, and/or other suitable processes. Referring to FIG. 5C, the conductive material 120 is etched back by a process tuned to selectively remove the conductive material 120 but not the spacer 116. The etching back process may be dry etching, wet etching, or other suitable etching technique, and may be preceded by a chemical-mechanical planarization (CMP) process. In the present embodiment, the conductive material 120 is etched until its top surface is below the top surface of the spacer 116. The remaining portions of the conductive material 120 become the source/drain contacts 120. In some embodiments, the top surface of the source/drain contacts 120 are below the top surface of the spacer 116 by a distance "$H_2$" that is about 0.2~4 of the height ("$H_1$") of the gate stack 110. In some embodiments, a further patterning process including a photolithography process and an etching process is performed to remove portions of the conductive material 120 so as to form the source/drain contacts 120 in defined areas over the active regions, such as shown in FIG. 2A.

Figures 5D, 5E, 5F:
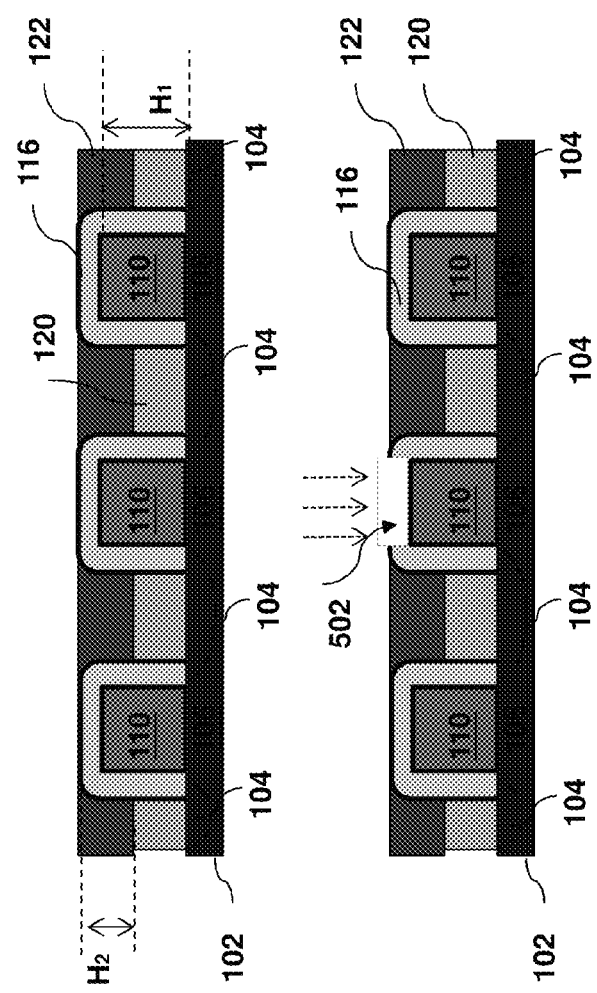

At operation 410, the method 400 (FIG. 4A) forms a contact protection layer 122 over the source/drain contacts 120 (FIGS. 5D and 5E). Referring to FIG. 5D, a dielectric material 122 is deposited over the substrate 102, over the source/drain contacts 120, and over the spacers 116. The dielectric material 122 may use titanium oxide ($TiO_2$), silicon oxide ($SiO_2$), silicon oxynitride (SiON), silicon nitride ($SiN_3$), combinations thereof, or other suitable material. The dielectric material 122 may be deposited using atomic layer deposition (ALD), CVD, and/or other suitable methods. Referring to FIG. 5E, a CMP process is performed to planarize the dielectric material 122 until the top surface of the spacer 116 is exposed. The remaining portions of the dielectric material 122 become the contact protection layer 122. In some embodiments, the CMP process results in a top surface of the contact protection layer 122 being substantially co-planar with the top surface of the spacers 116. In some embodiments, the top surface of the contact protection layer 122 may be slightly below the top surface of the spacers 116. The formation of the contact protection layer 122 is self-aligned in that it does not require a photolithography patterning process. Therefore, it is easy to be implemented in existing processes.

Figure 5G:
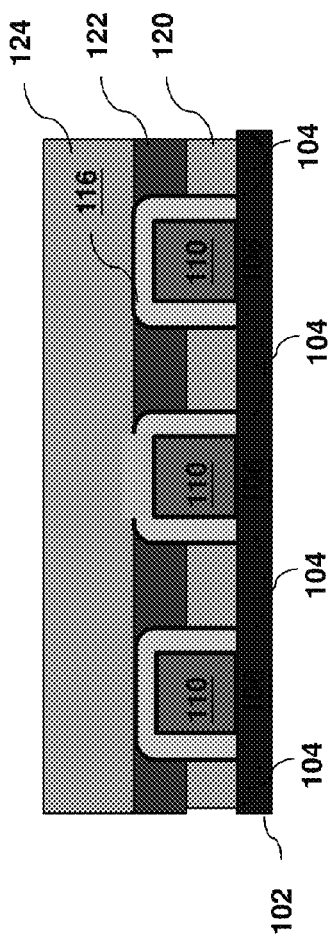
Figure 5H:
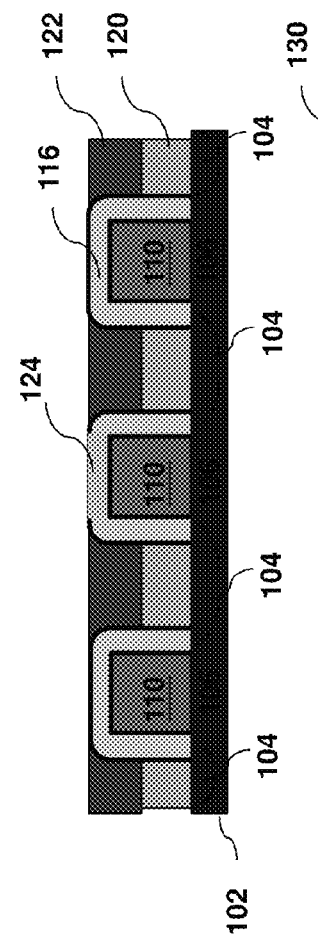

At operation 412, the method 400 (FIG. 4A) forms a gate open conductor 124 over the gate stack 110 (FIGS. 5F, 5G, and 5H). Referring to FIG. 5F, an anisotropic etching process is performed to the spacers 116. In the present embodiment, the anisotropic etching process is performed to a portion of the spacers 116 where the gate open conductor 124 is to be formed. This may be accomplished by a photolithography patterning process to create a masking element so as to cover the other portions of the spacers 116. The anisotropic etching process may use inductively coupled plasma (ICP) etching, reactive ion etching (RIE), and/or other suitable etching techniques. The etching process is selectively tuned to remove the spacer material 116 but not the contact protection layer 122. As a result, a recess 502 is formed over the top surface of the gate stack 110. Referring to FIG. 5G, a conductive material 124 is deposited over the contact protection layer 122, over the spacers 116, and filling the recess 502 over the gate stack 110. In an embodiment, the conductive material 124 is a metal such as aluminum (Al), tungsten (W), copper (Cu), cobalt (Co), combinations thereof, or other suitable material. The conductive material 124 can be deposited using a suitable process, such as CVD, PVD, plating, and/or other suitable processes. Referring to FIG. 5H, a CMP process is performed to planarize the conductive material 124 and to expose the top surfaces of the contact protection layer 122 and the spacers 116. As a result, a portion of the conductive material 124 remains in the recess 502 and becomes the gate open conductor 124. The gate open conductor 124 electrically contacts the gate stack 110 and provides a landing area for gate vias to be formed in a later operation.

Figure 5I:
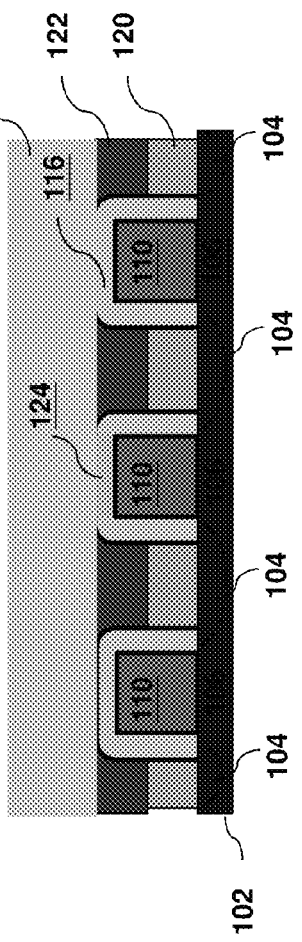

At operation 414, the method 400 (FIG. 4A) deposits an ILD layer 130 over the spacers 116, the contact protection layer 122, and the gate open conductor 124 (FIG. 5I). The ILD layer 130 may include dielectric materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), titanium oxide ($TiO_2$), silicon oxide ($SiO_2$), silicon oxynitride (SiON), silicon nitride ($SiN_3$), and/or other suitable dielectric materials. The ILD layer 130 may be deposited by a PECVD process or other suitable deposition technique.

Figure 5J:
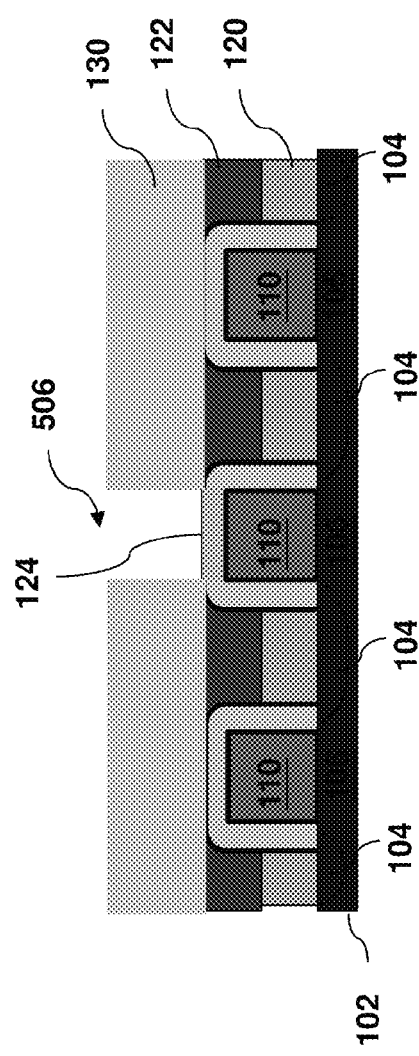
Figure 5K:
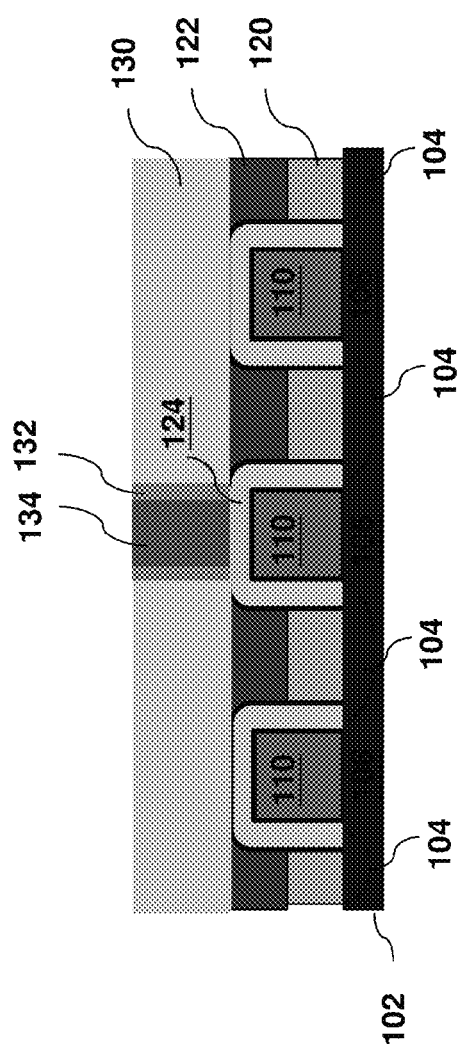

At operation 416, the method 400 (FIG. 4B) forms a gate via 134 through the ILD layer 130 and electrically contacting the gate open conductor 124 (FIGS. 5J and 5K). Referring to FIG. 5J, the ILD layer 130 is patterned by a process, such as a process including a photolithography process and an etching process, to form an opening 506. The opening 506 exposes the top surface of the gate open conductor 124. In an embodiment, the etching process has a higher etching rate to the ILD layer 130 than to the contact protection layer 122 and the spacers 116. For example, the etching selectivity between the ILD layer 130 and the other two layers (122 and 116) may be in a range from about 1.5:1 to about 1000:1. Referring to FIG. 5K, in the present embodiment, a barrier layer 132 is formed on the sidewalls of the opening 506, and a conductive material is subsequently filled in the remaining space of the opening 506 and forming the gate via 134. In an embodiment, the gate via 134 uses a conductive material such as aluminum (Al), tungsten (W), copper (Cu), cobalt (Co), combinations thereof, or other suitable material; and can be deposited using a suitable process, such as CVD, PVD, plating, and/or other suitable processes. A CMP process may be performed to planarize the top surface of the gate via 134. Due to the presence of the contact protection layer 122, the gate via 134 may be formed over any portion of the gate stack 110, including the portion of the gate stack 110 that overlaps the active regions 101 and 151 (FIG. 2A).

In another embodiment, after the ILD layer 130 has been formed at the operation 414, the method 400 proceeds to operation 418 (FIG. 4C) to form a local contact feature 128 (FIGS. 3A and 3B) connecting two source/drain regions before forming the gate via 134. This is described below with reference to FIGS. 5L-5R.

Referring to FIG. 5L, the ILD layer 130 and the contact protection layer 122 are patterned (e.g., by a photolithography process and an etching process) to form an opening 508. The opening 508 exposes a top surface of the source/drain contact 120. In an embodiment, the etching process includes a two-step process. The first step etches the ILD layer 130 and the second step etches the contact protection layer 122. When etching the ILD layer 130, the etching selectivity between the ILD layer 130 and the layers 122 and 116 may be in a range from about 1.5:1 to about 1000:1. When etching the contact protection layer 122, the etching selectivity between the contact protection layer 122 and the layers 130 and 116 may be in a range from about 1.5:1 to about 1000:1. In some embodiments, the ILD layer 130 and the contact protection layer 122 may be etched by the same etching process.

Referring to FIG. 5M, a barrier layer 126 is formed on sidewalls of the opening 508. In an embodiment, the barrier layer 126 is formed by depositing a material layer over the ILD layer 130, and on the sidewalls and floor of the opening 508. Then an anisotropic etching process is performed to remove portions of the material layer over the ILD layer 130 and over the floor of the opening 508, leaving the remaining portions of the material on the sidewalls of the opening 508 as the barrier layer 126.

Figure 5P:
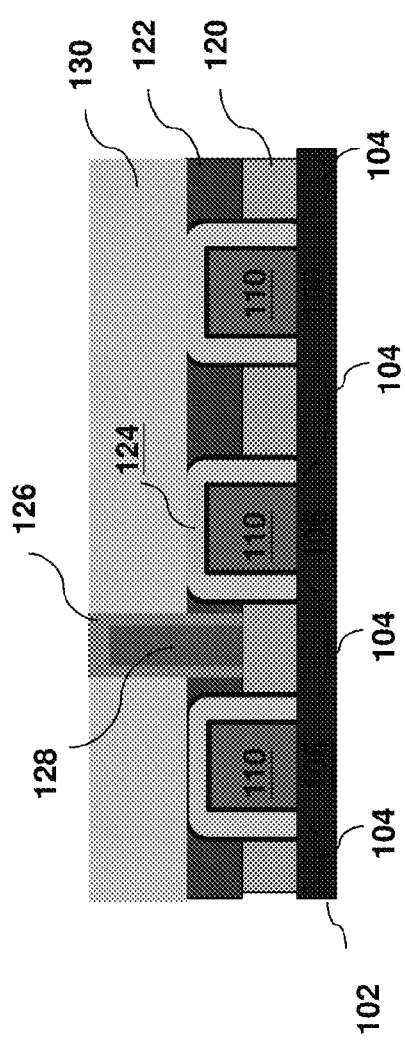

Referring to FIG. 5N, a conductive material 128 is filled into the space defined by the barrier layer 126 and over the top surface of the source/drain contact 120. In an embodiment, the conductive material 128 is a metal such as aluminum (Al), tungsten (W), copper (Cu), cobalt (Co), combinations thereof, or other suitable material. The conductive material 128 can be deposited using a suitable process, such as CVD, PVD, plating, and/or other suitable processes. Following the deposition process, a CMP process may be performed to planarize the top surface of the conductive material 128 and to expose a top surface of the ILD layer 130. Then, an etching back process is performed to the conductive material 128 thereby forming a recess 510 as defined by a top surface of the conductive material 128 and sidewalls of the barrier layer 126 (FIG. 5o). The remaining portion of the conductive material 128 becomes the local contact feature 128. Subsequently, the recess 510 is filled with a material substantially matching that of the barrier layer 126 (FIG. 5P).

Figure 5Q:
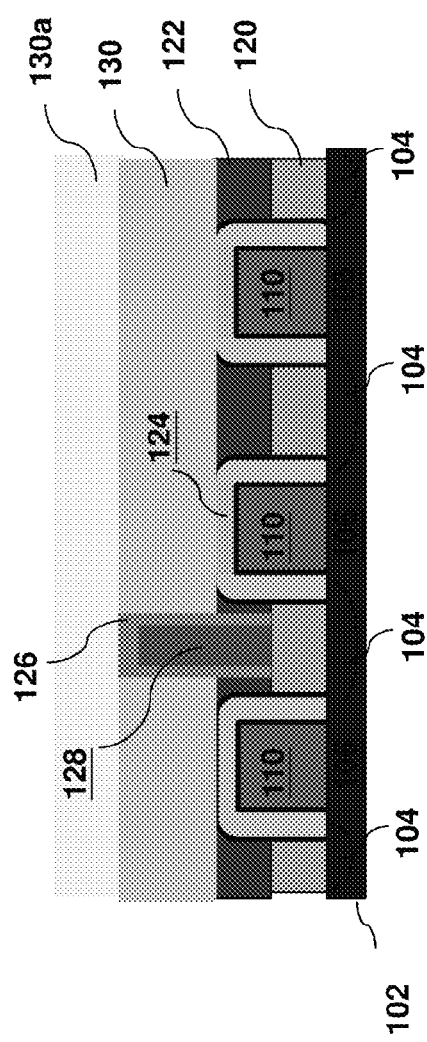

At operation 420, the method 400 (FIG. 4C) deposits another dielectric material 130a over the ILD layer 130 and over the barrier layer 126 (FIG. 5Q). In an embodiment, the dielectric material 130a is substantially the same as the material of the ILD layer 130. In alternative embodiments, the dielectric material 130a may be different from the material of the ILD layer 130.

Figure 5R:
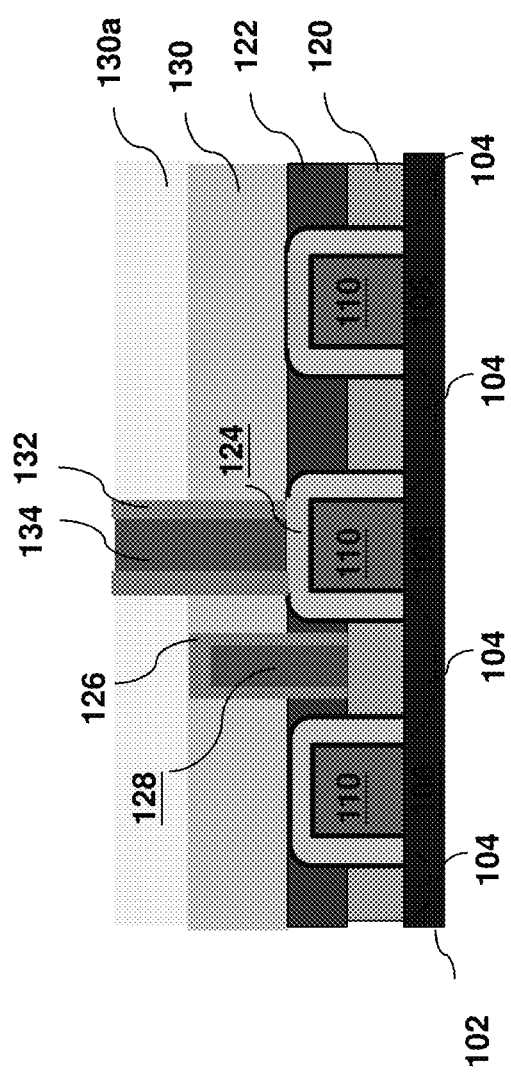

At operation 422, the method 400 (FIG. 4C) forms the gate via 134 electrically contacting the gate open conductor 124 (FIG. 5R). The operation 422 is similar to the operation 416 discussed above.

Although not intended to be limiting, one or more embodiments of the present disclosure provide many benefits to a semiconductor device and a formation process thereof. For example, transistors fabricated according to the present disclosure can have gate via landing areas anywhere along gate structures, even in areas that overlap active regions of the transistors from a top view. The presence of a contact protection layer over source/drain contacts prevents accidental shorts between the gate structures and the source/drain regions of the transistors. Circuit designers can utilize the present disclosure to reduce semiconductor device size so that greater functional density can be achieved, to increase device performance by expanding active regions and shrinking non-active regions, or to achieve both area reduction and performance enhancement at the same time. In addition, the formation method disclosed above is process variation tolerant and provides a robust solution for semiconductor device fabrication. The present disclosure can be used for fabricating not only planar FETs but also three-dimensional devices and multi-gate devices such as double gate FETs, FinFETs, tri-gate FETs, omega FETs, Gate-All-Around (GAA) devices, and vertical GAA devices.

In one exemplary aspect, the present disclosure is directed to a method of forming a semiconductor device. The method includes providing a substrate with a gate stack formed thereon. The substrate includes a source region, a drain region, and a channel region between the source and drain regions. The gate stack is disposed adjacent to the channel region. A top surface and sidewalls of the gate stack are covered by a spacer. The method further includes forming a first contact feature over the substrate, wherein the first contact feature electrically connects to at least one of the source region and the drain region and a top surface of the first contact feature is lower than a top surface of the spacer. The method further includes forming a first dielectric layer over the first contact feature.

In another exemplary aspect, the present disclosure is directed to a method of forming a semiconductor device. The method includes providing a substrate having a first active region and a second active region, the first and second active regions being spaced apart by a non-active region. The method further includes forming gate structures over the first and second active regions and forming source/drain regions in the first and second active regions adjacent to the gate structures. The method further includes forming source/drain contacts over the source/drain regions, wherein a top surface of the source/drain contacts is lower than a top surface of the gate structures. The method further includes forming a contact protection layer over the source/drain contacts, wherein a top surface of the contact protection layer is substantially co-planar with the top surface of the gate structures.

In yet another exemplary aspect, the present disclosure is directed to a semiconductor device. The semiconductor device includes a substrate that has a source region, a drain region, and a channel region between the source and drain regions. The semiconductor device further includes a gate structure over the substrate and adjacent to the channel region, wherein the gate structure includes a gate stack and a spacer on at least sidewalls of the gate stack. The semiconductor device further includes a first contact feature over the substrate and electrically connecting to at least one of the source region and the drain region, wherein a top surface of the first contact feature is lower than a top surface of the gate structure. The semiconductor device further includes a first dielectric layer over the first contact feature, wherein a top surface of the first dielectric layer is substantially co-planar with the top surface of the gate structure.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    providing a substrate with a gate stack formed thereon, the substrate having a source region, a drain region, and a channel region between the source and drain regions, the gate stack being disposed above the channel region, a top surface and sidewalls of the gate stack being covered by a spacer;
    forming a first contact feature over the substrate, the first contact feature electrically connecting to at least one of the source region and the drain region, a top surface of the first contact feature being lower than a top surface of the spacer;
    forming a first dielectric layer over the first contact feature;
    forming a recess in the spacer thereby exposing the top surface of the gate stack; and
    forming a gate open conductor in the recess, wherein the gate open conductor does not physically contact the first dielectric layer.

2. The method of claim 1, wherein forming the first contact feature includes:
    depositing a first conductive material over the substrate and over the spacer; and
    performing an etching process selectively tuned to remove the first conductive material while the spacer remains until a top surface of the first conductive material is lower than the top surface of the spacer, leaving a remaining portion of the first conductive material as the first contact feature.

3. The method of claim 1, wherein forming the first dielectric layer includes:
    depositing a first dielectric material over the substrate, the first contact feature, and the spacer; and
    performing a chemical-mechanical planarization (CMP) process to the first dielectric material thereby exposing the top surface of the spacer.

4. The method of claim 1, wherein the forming of the recess includes: performing a first anisotropic etching process to the spacer thereby exposing the top surface of the gate stack, resulting in the recess over the top surface of the gate stack and surrounded by the spacer of the gate stack, wherein the first anisotropic etching process is selectively tuned to remove the spacer while the first dielectric layer substantially remains.

5. The method of claim 4, wherein forming the gate open conductor includes:
    depositing a second conductive material filling the recess and over the first dielectric layer; and
    performing a chemical-mechanical planarization (CMP) process to the second conductive material thereby exposing the top surface of the first dielectric layer, resulting in a remaining portion of the second conductive material in the recess as the gate open conductor.

6. The method of claim 4, further comprising:
    depositing a second dielectric layer over the first dielectric layer and the gate open conductor;
    forming an opening through at least the second dielectric layer, the opening exposing a top surface of the gate open conductor; and
    forming a via in the opening, the via electrically contacting the gate open conductor.

7. The method of claim 6, wherein the via overlaps the channel region from a top view.

8. The method of claim 4, further comprising:
    depositing a second dielectric layer over the first dielectric layer and the gate open conductor;
    forming a first opening through at least the second and first dielectric layers, the first opening exposing the first contact feature; and
    forming a second contact feature in the first opening, the second contact feature electrically connecting the first contact feature to another semiconductor device.

9. The method of claim 8, wherein forming the second contact feature includes:
    forming a barrier layer on sidewalls of the first opening, wherein the first contact feature is still exposed through a first space in the first opening;
    filling the first space with a third conductive material;
    etching back a portion of the third conductive material, resulting in a second space defined by a top surface of the third conductive material and sidewalls of the barrier layer; and filling the second space with a material substantially matching the barrier layer.

10. The method of claim 8, further comprising:
forming a second opening through at least the second dielectric layer thereby exposing a top surface of the gate open conductor; and
forming a via in the second opening electrically contacting the gate open conductor, wherein the via overlaps the channel region from a top view.

11. A method of forming a semiconductor device, the method comprising:
providing a substrate having a first active region and a second active region, the first and second active regions being spaced apart by a non-active region;
forming gate structures over the first and second active regions, wherein each of the gate structures includes a gate stack, a spacer covering top and sidewalls of the gate stack, a recess in the spacer, the recess exposing the top of the gate stack, and a gate open conductor in the recess;
forming source/drain regions in the first and second active regions, the source/drain regions adjacent to the gate structures;
forming source/drain contacts over the source/drain regions, a top surface of the source/drain contacts is lower than a top surface of the gate structures; and
forming a contact protection layer over the source/drain contacts, a top surface of the contact protection layer being substantially co-planar with the top surface of the gate structures, wherein the gate open conductor in each of the gate structures does not overlap in plan view with the contact protection layer.

12. The method of claim 11, wherein forming the source/drain contacts includes:
depositing a first conductive material over the source/drain regions, the first conductive material electrically contacting the source/drain regions; and
etching back the first conductive material until a top surface of the first conductive material is below the top surface of the gate structures, leaving remaining portions of the first conductive material as the source/drain contacts.

13. The method of claim 11, further comprising:
depositing a dielectric layer over the gate structures and over the contact protection layer; and
forming gate vias through at least the dielectric layer, the gate vias electrically contacting the gate structures, wherein at least one of the gate vias is in one of the first and second active regions from a top view.

14. The method of claim 11, further comprising:
depositing a first dielectric layer over the gate structures and over the contact protection layer;
etching an opening through the first dielectric layer and the contact protection layer between two of the gate structures, the opening exposing a first one of the source/drain contacts in the first active region and a second one of the source/drain contacts in the second active region; and
forming a contact feature in the opening, the contact feature electrically connecting the first one of the source/drain contacts and the second one of the source/drain contacts.

15. The method of claim 14, further comprising:
depositing a second dielectric layer over the first dielectric layer and over the contact feature; and
forming gate vias through at least the first and second dielectric layers, the gate vias electrically contacting the gate structures, wherein at least one of the gate vias is in one of the first and second active regions from a top view.

16. A method of forming a semiconductor device, the method comprising:
providing a substrate having a source region, a drain region, and a channel region between the source and drain regions;
forming a gate structure over the substrate and adjacent to the channel region, wherein forming the gate structure includes forming a gate stack and depositing a dielectric material over top and sidewall surfaces of the gate stack as a spacer;
forming a first contact feature over the substrate and electrically connecting to at least one of the source region and the drain region, wherein a top surface of the first contact feature being lower than a top surface of the gate structure;
depositing a first dielectric layer over the first contact feature, wherein a top surface of the first dielectric layer is substantially co-planar with the top surface of the gate structure;
forming a recess in the spacer thereby exposing the top surface of the gate stack; and
forming a gate open conductor in the recess, wherein the gate open conductor at most partially overlaps in plan view with the first dielectric layer.

17. The method of claim 16, wherein the first dielectric layer has a thickness that is about 0.2~4 times of a height of the gate stack.

18. The method of claim 16, wherein:
the gate stack has a first dimension along a gate length direction of the semiconductor device;
the first contact feature has a second dimension along a gate width direction of the semiconductor device; and
the second dimension is greater than about 1.6 times of the first dimension.

19. The method of claim 16, further comprising:
forming a via over the gate open conductor and electrically contacting the gate open conductor, wherein the via overlaps the channel region from a top view.

20. The method of claim 16, wherein the substrate further includes a second source/drain region in another portion of the substrate, the method further comprising:
forming a second contact feature over the second source/drain region and electrically connecting to the second source/drain region, the second contact feature being of substantially the same height as the first contact feature; and
forming a third contact feature contacting the first and second contact features and partially overlapping the first and second contact features from a top view, wherein the third contact feature has a smaller dimension than the first contact feature in a gate length direction of the semiconductor device.

* * * * *